United States Patent
Jen et al.

(10) Patent No.: US 7,709,364 B1
(45) Date of Patent: May 4, 2010

(54) METHOD AND APPARATUS FOR LOW TEMPERATURE ION IMPLANTATION

(75) Inventors: Ko-Chuan Jen, San Jose, CA (US); Cheng-Hui Shen, Hsin-Chu (TW)

(73) Assignee: Advanced Ion Beam Technology, Inc., Hsin-Shu (TW)

( * ) Notice: Subject to any disclaimer, the term of this patent is extended or adjusted under 35 U.S.C. 154(b) by 0 days.

(21) Appl. No.: 12/468,822

(22) Filed: May 19, 2009

(51) Int. Cl.
  *H01L 21/265* (2006.01)
(52) U.S. Cl. .................................................. 438/514
(58) Field of Classification Search .......... 438/510–532
  See application file for complete search history.

(56) References Cited

U.S. PATENT DOCUMENTS 6,365,492 B1 * 4/2002 Suguro et al. ............... 438/514

* cited by examiner

*Primary Examiner*—Savitri Mulpuri
(74) *Attorney, Agent, or Firm*—Stout, Uxa, Buyan & Mullins, LLP

(57) ABSTRACT

Techniques for low temperature ion implantation are disclosed. After a wafer is cooled to a temperature lower than a temperature of an environment outside of a chamber where the wafer is implanted, the cooled wafer is implanted by projecting an ion beam on the cooled wafer with a temperature adjusting apparatus being operated to cool the wafer simultaneously. Hence, heat produced by the ion beam on the implanted wafer is essentially removed by the temperature adjusting apparatus. Then, after the majority of the implanting process is performed, the temperature adjusting apparatus is turned down or off. Hence, during the residual implanting process, heat produced by the ion beam on the implanted wafer at least partially increases the temperature of the implanted wafer so that, after the ion implantation process is finished, the wafer can be moved into the environment with no, or at least less, water condensation.

13 Claims, 6 Drawing Sheets

METHOD AND APPARATUS FOR LOW TEMPERATURE ION IMPLANTATION

BACKGROUND OF THE INVENTION

1. Field of the Invention

The present invention generally relates to low temperature ion implantation, and more particularly to water condensation problems associated with low temperature ion implantation.

2. Description of the Prior Art

Low temperature ion implantation is a new branch of ion implantation. It has been discovered that a relatively low wafer temperature during ion implantation is advantageous for formation of shallow junctions, especially ultra-shallow junctions, which are becoming more and more important for continued miniaturization of semiconductor devices. Besides, the technique also has proven useful for enhancing the yield of ion implantation.

In the beginning of the current low temperature ion implantation process, a wafer is moved from an environment, such as an atmosphere or ambient environment, into an implanter, and is cooled to a temperature lower than a temperature of the environment, such as a temperature lower than the freezing point of water. Herein, the wafer can be cooled at least in a cassette outside of the implanter, in a loadlock of the implanter, in a chamber of the implanter, and so on. After the wafer is cooled, an implanting process is performed in the chamber to implant the cooled wafer. The wafer can be cooled and implanted in the same position or different positions. Moreover, during the implanting process, a temperature adjusting apparatus may be used to keep the temperature of the implanted wafer low enough, such as below the freezing point of water. In general, both the operation of the temperature adjusting apparatus and the practical implantation parameters used by the implanting process are kept constant, such that the implanted result is uniformly distributed over the implanted wafer. After that, the implanted and cooled wafer is moved out of the implanter to the environment for further semiconductor fabrication processing.

However, a serious disadvantage referred to as "water condensation" is associated with the mentioned cooling technique, due to a significant temperature difference between the low temperature ion implantation, usually performed below room temperature, such as at about −15~−25° C. or even lower, and the temperature of the ambient environment, usually at room temperature, i.e., about 15~25° C. Therefore, if the implanted and cooled wafer is directly moved from the chamber to the environment after the implanting process is finished, "water condensation" on the surface of the wafer induced by the temperature difference is almost unavoidable. Then, the surface of the wafer must be treated to remove the condensed water before additional semiconductor fabrication processes are performed.

One common solution is to treat the surface of the wafer after the wafer is moved out of the ion implanter and before any following semiconductor fabrication processing, such that the condensed moisture is removed prior to such processing. While this common solution addresses the damage of condensed moisture by removing it after formation, it does not prevent the formation of the condensed moisture from occurring in the first place. Hence, the cost is high, and unpredictable damage to micro-structures of wafers may be unavoidable.

Another common solution is to temporarily locate the implanted wafer inside of the ion implanter, such that the wafer is moved out of the ion implanter only after the wafer temperature has naturally been raised in a vacuum environment. As usual, a long temperature recovery time is required to allow the wafer temperature to be raised from the temperature of the implanting process to the temperature of the external environment. Clearly, this common solution solves the problem of condensed moisture by simply using the vacuum environment to prevent formation of moisture during the period of raising the wafer temperature. Unavoidably, a long temperature recovery time for naturally raising the wafer temperature inside the ion implanter reduces throughput.

Accordingly, there is a need to propose a novel and effective approach to resolve the "water condensation" problem associated with low temperature ion implantation.

SUMMARY OF THE INVENTION

The present invention provides a new approach for improving "water condensation" in the performance of low temperature ion implantation, and for improving "water condensation" with low cost, short duration and a simple process.

According to a feature of the invention, the operation of a temperature adjusting apparatus is varied during the implanting process. Firstly, during a majority (e.g., a former majority) of the implanting process, the temperature adjusting apparatus keeps the temperature of the implanted wafer lower than a temperature of the environment where the wafer is to be moved after the implanting process. After that, during a minority (e.g., a latter minority) of the implanting process, the temperature adjusting apparatus is turned down or off, such that the temperature of the implanted wafer after the latter minority is higher than the temperature after the former majority.

Another feature of the invention is that no extra heating apparatus and no extra heating step is indispensable after the implanting process is finished. In the invention, the temperature of the implanted wafer is essentially adjusted during the implanting process. Hence, no extra heating step is indispensable. Moreover, the temperature of the implanted wafer is essentially adjusted by adjusting the operation of the temperature adjusting apparatus used to control the wafer temperature during the implanting process. Hence, no extra heating apparatus is indispensable. Nevertheless, an extra heating apparatus and an extra heating step may be optional after the temperature of the implanted wafer is adjusted during the implanting process. Herein, when the operation of the temperature adjusting apparatus is decreased and/or it is turned off, at least a portion of the heat produced by the ion implantation is not carried away by the temperature adjusting apparatus and then the temperature of the implanted wafer is increased.

As usual, the environment is an environment outside of a chamber where the wafer is implanted, but the invention allows for other environments. For example, if the wafer is moved into a cassette after the implanting process, then the environment may be the environment inside the cassette. Moreover, the wafer temperature may be reduced to be lower than the freezing point of the water because the wafer temperature usually is lower than that for current low temperature ion implantation, but the invention also allows to reduce the wafer temperature to a temperature higher than the freezing point of the water. Indeed, whenever the temperature difference between the temperature of implanted wafer and the temperature of an environment that the implanted wafer will be moved into is high enough to induce the water condensation, the invention can be applied to resolve the water condensation problem.

Significantly, the invention never limits the practical ratio between the former majority and the latter minority, the details of the temperature adjusting apparatus, the temperature difference between the former majority and the latter minority, etc. All variables are adjustable and dependent on the practical requirements.

DETAILED DESCRIPTION OF THE INVENTION

Figure 1A:
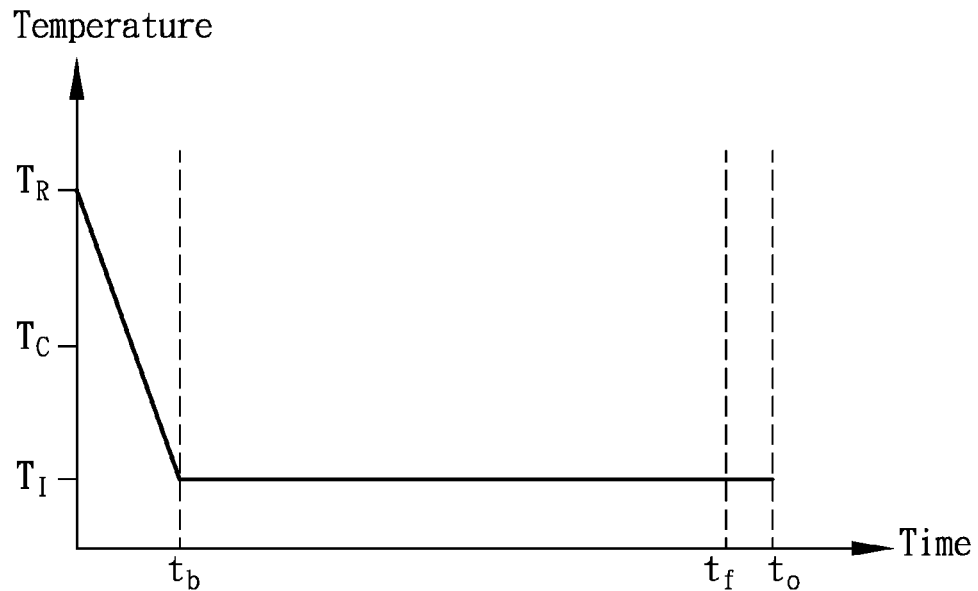
FIG. 1A and FIG. 1B diagram two conventional low temperature ion implantations.

A detailed description of the present invention will now be provided in the context of the following embodiments, which are not intended to limit the scope of the present invention and which can be adapted for other applications. While the drawings are illustrated in detail, it is appreciated that the quantity of the disclosed components may be greater or less than that disclosed, except for instances expressly restricting the amount of the components.

The proposed invention divides the whole implanting process into a former majority and a latter minority. During the former majority, as with most of the prior art techniques discussed above, a temperature adjusting apparatus coupled with the implanted wafer is used to keep the temperature of the implanted wafer lower than (e.g., or at) a required temperature (usually lower than a temperature of environment). Herein, the temperature is kept essentially low enough such that water condensation is almost unavoidable when the implanted and cooled wafer is removed from an implanter. Then, during the latter minority, the operation of the temperature adjusting apparatus is decreased or stopped, such that the temperature of the implanted and cooled wafer is increased.

Undoubtedly, whenever the practical parameters' values are the same, the temperature of the implanted wafer in the majority is equal to that of the prior art implementations mentioned above. Therefore, without doubt, the temperature of the implanted wafer in the minority is automatically higher than that of the prior art methods mentioned above. Clearly, because "water condensation" is induced by the temperature difference between the lower wafer temperature and the higher room temperature, the higher the wafer temperature is, the lower the water condensation. Accordingly, because the wafer temperature is increased in the minority, the water condensation can be properly resolved.

In other words, to adjust the temperature of the implanted wafer, the temperature adjusting apparatus is operated in a first state to keep the wafer temperature lower in the majority, and is operated in a second state to increase the wafer temperature in the minority. Herein, the temperature adjusting apparatus is changed from the first state to the second state after the majority of the implanting process is finished. Moreover, even when the temperature adjusting apparatus does not actively apply any heat to the implanted wafer in the minority when the temperature adjusting apparatus is in the second state, the heat produced by the implanting process in the wafer will at least partially stay in the wafer followed by increases in the temperature of the wafer.

Further, the invention does not limit the wafer temperature to being changed only by the temperature adjusting apparatus. Indeed, the ion beam implanted to the wafer also produces heat on the wafer. Therefore, a basic feature of the invention can be viewed as comprising one or more of the following: (1) the net heat applied to the implanted wafer is higher in the majority, but is lower in the minority, when the net heat is a difference between the heat added to the wafer by the implanted ion beam and the heat carried away from the wafer by the temperature adjusting apparatus; and (2) the temperature of the implanted wafer is lower in the majority, but is higher in the minority.

To emphasize the characteristics of the invention, the below description will briefly focus on the case where the heat produced by the ion beam is constant. However, when the ion beam current is varied, the below description also can be applied by simply adding the effect of the varied ion beam current on the heat applied to the implanted wafer or on the temperature of the implanted wafer.

Accordingly, basic characteristic(s) of the invention and difference(s) between the invention and the prior art mentioned above are shown in the figures and discussed below. Herein, $T_R$ indicates the room temperature of the environment, $T_c$ indicates the temperature that would cause water condensation when the wafer temperature is directly changed from Tc to $T_R$, $T_I$ indicates the wafer temperature during the implanting process, and $T_H$ indicates the wafer temperature when the wafer is heated before the wafer is moved out of the implanter. In these figures, $T_I$ is a fixed temperature value. However, $T_I$ also can be a temperature range if the implanting process only requires the wafer temperature to be lower than a critical temperature. Herein, $t_b$ indicates the beginning of the implanting process, $t_f$ indicates the finishing of the implanting process, $t_o$ indicates when the wafer is just moved out of the implanter, $t_h$ indicates when the implanting process is just changed from the former majority to the latter minority, and $t_e$ indicates when an extra heating process after the implanting process is finished.

FIG. 1A shows a prior-art plot of time versus temperature. Here, the wafer is cooled before the implanting process such that the wafer temperature is changed from $T_R$ to $T_I$. Then, from $t_b$ to $t_f$, the implanting process is performed while the wafer temperature is kept at $T_I$. Finally, after the implanting process is finished, from $t_f$ to $t_o$, the wafer is moved out of the implanter. Clearly, owing to the short duration of time required to remove the wafer, the wafer temperature is almost still equal to $T_I$ at the time of its reintroduction back into the environment. Reason and experience dictate that water condensation will form at this moment.

Figure 1B:
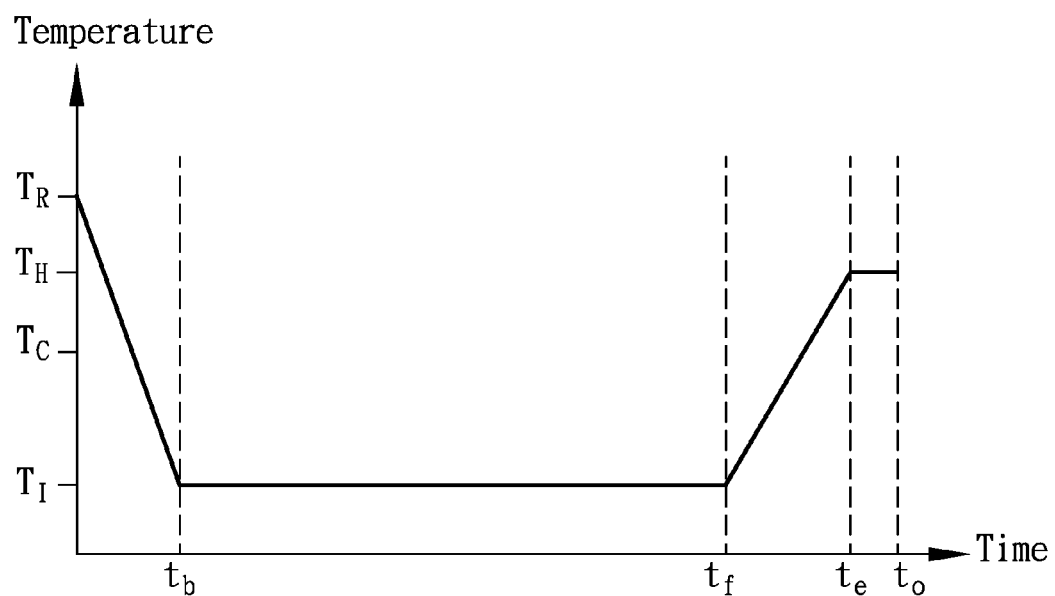

FIG. 1B shows a similar plot for another prior-art scenario. Here, the wafer is cooled before the implanting process such that the wafer temperature is changed from $T_R$ to $T_I$. Then, from $t_b$ to $t_f$, the implanting process is performed while the wafer temperature is kept at $T_I$. Then, an extra heating step is performed from $t_f$ to $t_e$, such that the wafer temperature is increased from $T_I$ to $T_H$. Again, the wafer temperature still is almost equal to $T_H$ when the wafer moved into the environment. Clearly, the temperature difference between the wafer and the atmosphere is decreased because of the increment of the wafer temperature from $T_I$ to $T_H$. It stands to reason, then, that water condensation will be reduced or eliminated.

Figure 2A:
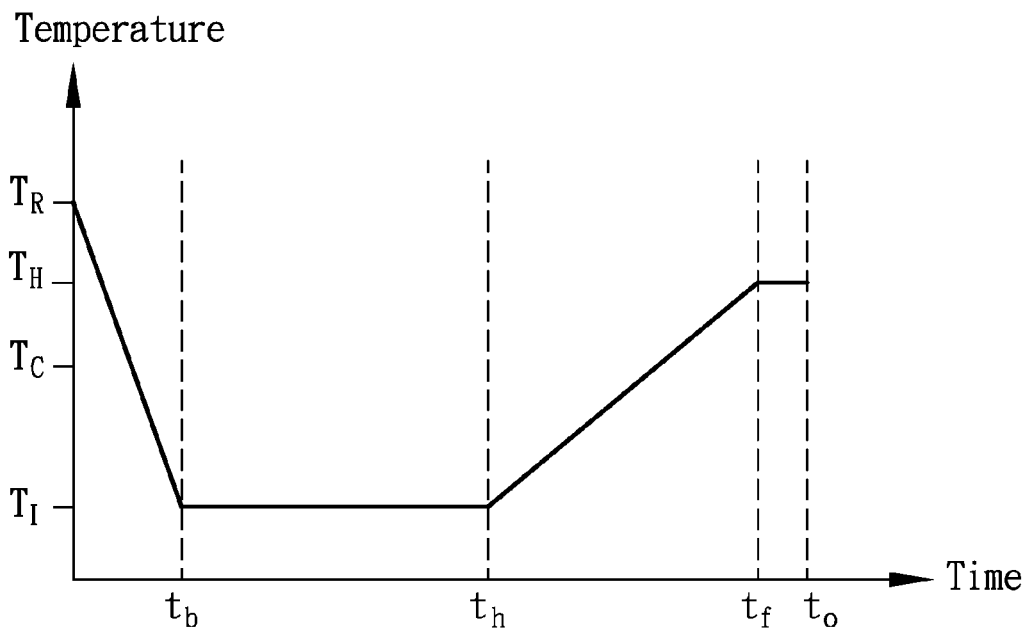
FIG. 2A to FIG. 2E are diagrams of low temperature ion implantation according to examples of the invention.

FIG. 2A shows an exemplary plot of time versus temperature for an implementation of the invention. Here, the wafer is cooled before the implanting process such that the wafer temperature is changed from $T_R$ to $T_I$. Then, from $t_b$ to $t_h$, the implanting process is performed while the wafer temperature is kept at $T_I$ by a temperature adjusting apparatus during the majority of the implanting process. Then, by adjusting the operation of the temperature adjusting apparatus from $t_h$ to $t_f$, the wafer temperature is increased from $T_I$ to $T_H$. After that, the wafer is moved out of the implanter. Clearly, during the minority of the implanting process, the wafer is implanted and heated simultaneously. Therefore, not only is the water condensation issue resolved; the total duration of the low temperature ion implantation process is also decreased. Particular notice can be made to the absence of a duration from $t_f$ to $t_e$ which is required in the FIG. 1B plot.

Figure 2B:
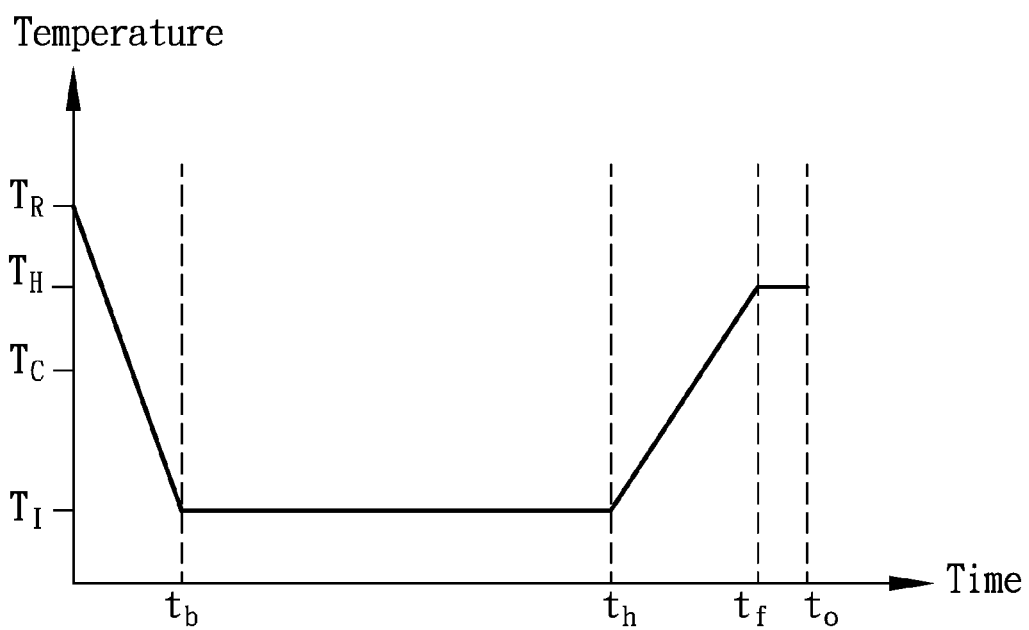

FIG. 2B shows a plot corresponding to another example of the invention. Here, the example is essentially similar to the above example, with the only differences being the duration of the minority (between $t_h$ and $t_f$) shortened and the wafer temperature increment (between $T_H$ and $T_I$) decreased. However, the example does not indicate that the wafer temperature increment is proportional to the duration of the minority. Instead, the example emphasizes that the invention is not limited to a particular duration of the minority or wafer temperature difference.

Figure 2C:
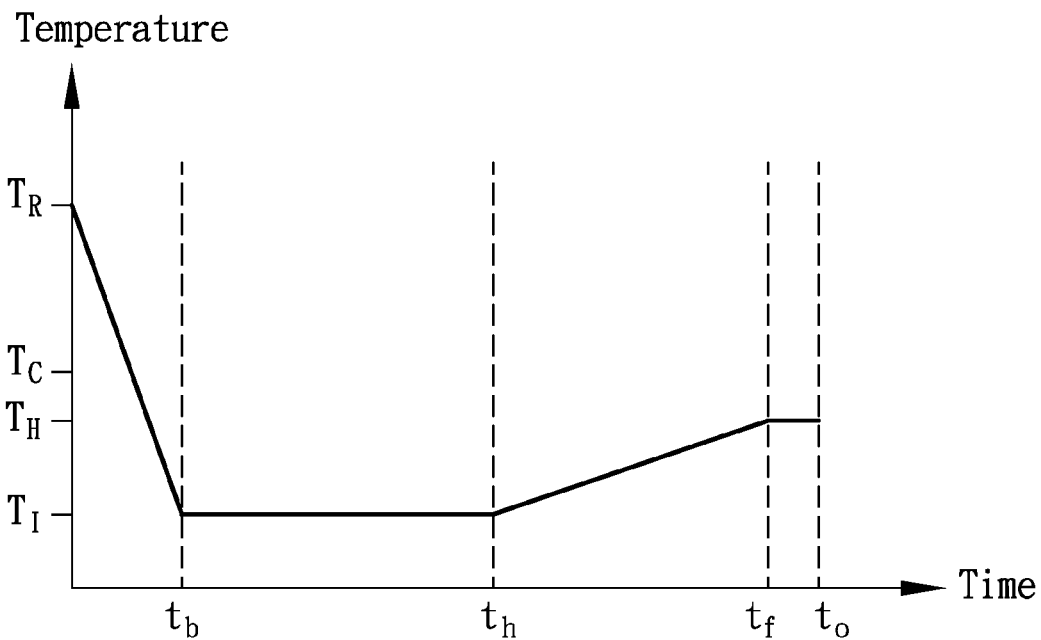
Figure 2D:
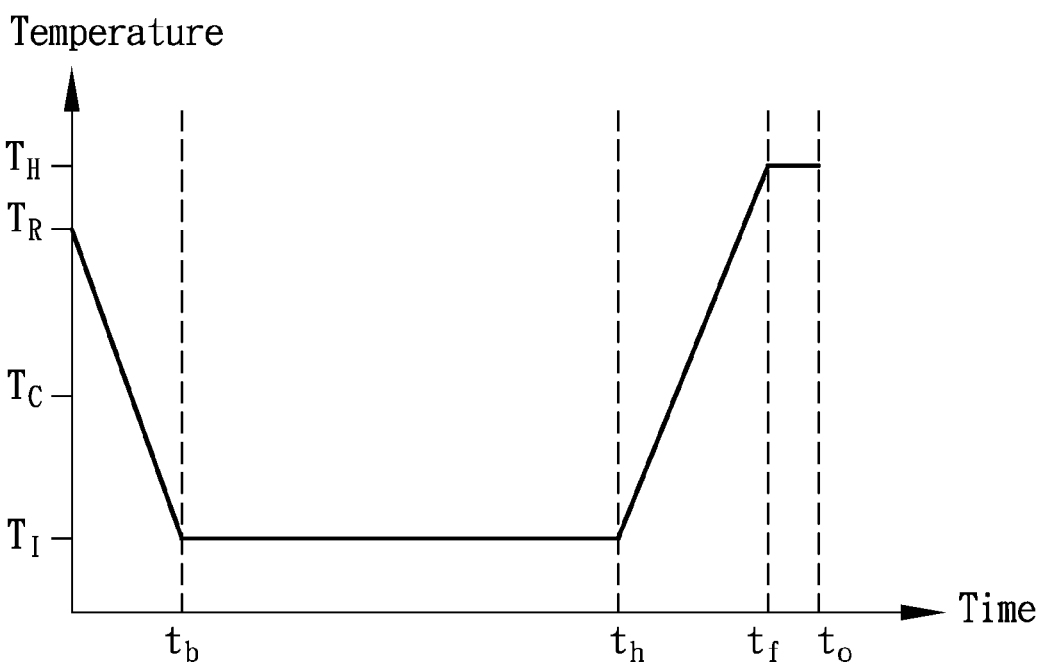

FIG. 2C and FIG. 2D show two more plots corresponding to examples of the invention in which both the temperature increment (between $T_H$ and $T_I$) and the duration of the minority (between $t_h$ and $t_f$) are varied (e.g., varied independently). Particular notice is made to the fact that $T_H$ is higher than $T_R$ in FIG. 2D, which means the wafer temperature can be higher than the room temperature before the wafer is moved out of the implanter.

Furthermore, the temperature of the wafer in the majority (the first temperature) can be the average wafer temperature during the majority portion of the implanting process or the wafer temperature at or near the finishing of the majority portion of the implanting process, without affecting the characteristics of the invention. Similarly, the temperature of the wafer in the minority (the second temperature) can be the average wafer temperature during the minority portion of the implanting process or the wafer temperature at the finish of the minority portion of the implanting process. Indeed, the invention allows the second temperature to be gradually increased, even fluctuantly increased, during the minority portion of the implanting process. Clearly, the basic feature of the invention is not affected by the definition of the first temperature and the second temperature, although the difference will affect the quantitative calculation concerning the effect of the invention.

Furthermore, the invention does not need to be limited to particular details on how to accomplish the invention. For instance, the invention does not need to be limited to particular details concerning the temperature adjusting apparatus. Any well-known, on-developing or to-be-engineered mechanism capable of adjusting the wafer temperature during low temperature ion implantation can be used as the temperature adjusting apparatus. The only requirement is that the ability to affect wafer temperature must be adjustable. An example is the popular cooling mechanism that applies a gas to the backside of the implanted wafer to carry away (i.e., remove) the heat produced by the ion beam. Owing at least to the gas flow rate and/or the temperature of the gas being adjustable, the invention can use a larger gas flow rate or lower gas temperature to keep the wafer temperature lower in the majority, and can use a smaller gas flow rate and/or higher gas temperature to increase the wafer temperature in the minority.

For example, the invention does not need to be limited to a particular ratio of the majority to the minority. The ratio can be adjusted at least according to the required wafer temperature variation during the minority for a given application. As an example, if uniformity of the implanted ions is very important, the duration of the minority can be increased when the net temperature variation in the minority is fixed. Longer durations of the minority can be matched with smaller temperature raising rates in the minority. And then, a smaller temperature raising rate can effectively ensure that thermal diffusion of implanted ions in different but neighboring portions of the implanted wafer is almost the same, such that the distribution of implanted ions has no obvious or unacceptable variation. As another example, if the heat produced by the ion beam is large enough to induce phase transition of the surface of the implanter wafer, the duration of the minority can be decreased when the cooling ability of the temperature adjusting apparatus is fixed. Shorter durations of the minority can be implemented for smaller phase transitions in the minority. And then, a short phase transition period can minimize the phase transition occurrence in the implanted wafer, such that the implanted result can be essentially non-degraded by the increase of the wafer temperature in the minority.

Nor does the invention need to be limited to particular wafer temperature differences between the majority (the first temperature) and the minority (the second temperature). The wafer temperature in the minority can be adjusted according to one or more of the following: (1) the higher the wafer temperature in the minority is, the smaller the temperature difference is when the wafer is moved into the environment; therefore, the increment of the wafer temperature in the minority can effectively prevent the water condensation of the wafer; and (2) the higher the wafer temperature in the minority is, the more net heat is applied to the wafer in the minority; therefore, the increment of the wafer temperature in the minority may unavoidably affect the implanted result of the implanting process.

Figure 2E:
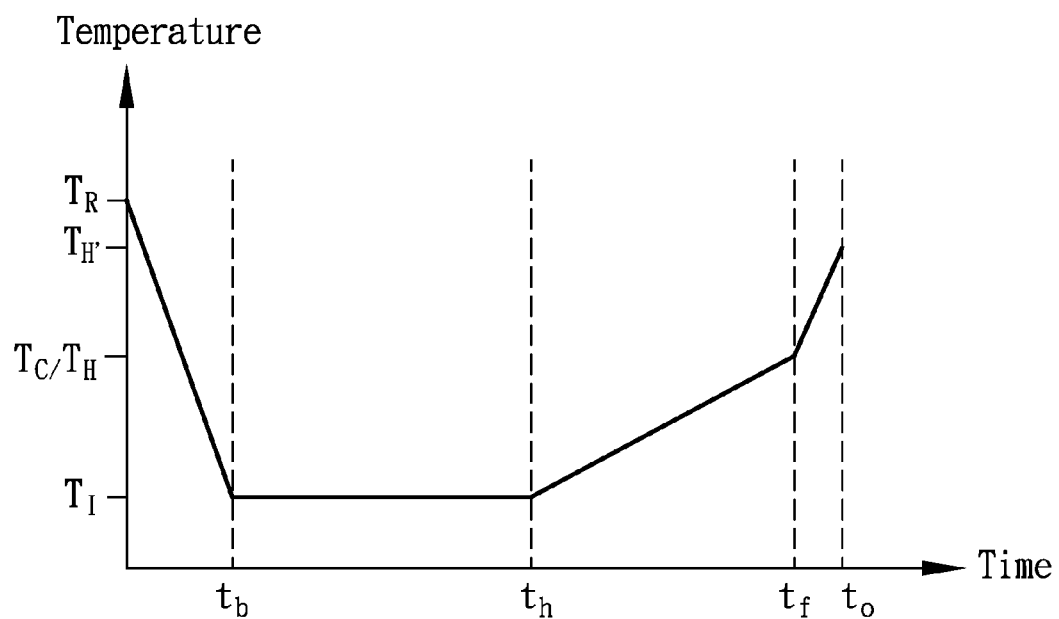

Accordingly, as shown in FIG. 2E, another potential example comprises the wafer temperature being increased in at least two stages (to $T_H$ and $T_{H'}$ in sequence) but not only in the minority (only one stage to $T_H$). Herein, the wafer temperature is first increased in the minority, and then is increased by a heater, or a heating process, inside the implanter. Finally, the wafer with increased temperature is moved into the environment. Clearly, owing to the increment of wafer temperature being achieved in at least two stages, i.e., at least two heating processes, the increment of wafer temperature in the minority can be decreased, and then the implanter result of the implanting process may not be significantly affected. Further, if the heating ability of the extra heater used in the case shown in FIG. 2E is equal to the heating ability of the heater used in the example shown in FIG. 1B, because partial increment of wafer temperature from $T_I$ to $T_H$ is done in the minority in the example shown in FIG. 2E, the duration required by the heater used by the invention will be shorter than the duration required by the extra heater used by the prior art. In other words, the duration of the example shown in FIG. 2E is significantly shorter than the duration of the prior art shown in FIG. 1B.

Herein, a potential heater can be a gas source providing warm nitrogen gas to the implanted wafer in the implanter, especially to heat the implanted wafer in the loadlock of the implanter to minimize pollution in the chamber.

For instance, to adjust the wafer temperature during the implanting process, the temperature adjusting apparatus may have a cooler for cooling the implanted wafer and an optional heater for heating the implanter wafer. Therefore, when the temperature adjusting apparatus should be changed from the first state to the second state and/or when wafer temperature should be increased in the minority (corresponding to the second state), not only an operation of the cooler can be decreased or ceased, but also an operation of the heater in the temperature adjusting apparatus can be increased or initiated. Of course, the cooler and the heater can be adjusted separately or together. For example, the operation of the cooler may be decreased when an operation of the heater is kept constant, the operation of the cooler may be kept constant when the operation of the heater is enhanced, the operation of the cooler may be decreased when the operation of the heater is enhanced, the operation of the cooler may be decreased or it may be off when the heater is off, and the operation of the cooler may be enhanced when the operation of the heater is enhanced more.

As an example, the cooler may have a gas source and at least one gas pipeline for providing a gas to a backside of the wafer for removing heat, and also may have a coolant and at least one coolant pipeline for providing a coolant to a chuck holding the wafer for cooling the wafer through a heat exchange between the wafer and the chuck. As another example, the heater may be one or more of a resistor coil within a chuck holding said wafer so as to cause heat appearing on the resistor coil to be delivered through the chuck to the wafer, and a light source within a chamber surrounding the wafer during the implanting process so as to project light on the wafer followed by the temperature of the wafer being increased.

Besides the above advantages, the invention may have an additional advantage when the temperature adjusting apparatus uses a gas to cool a backside of the wafer and the wafer is held by an electrostatic chuck during the implanting process. Here, owing to the gas flow rate being decreased in the minority, the gas pressure applied on the implanted wafer also is decreased. Hence, when the power of the electrostatic chuck is turned down or decreased as the implanting process is almost finished or entirely finished, the decreased pressure induced by the residual gas will not push the wafer far (e.g., too far) away. Clearly, if there is any hardware close to the implanted wafer, the risk of collision is decreased; also, to the extent a robot is used to move the implanted wafer, the risk of improper catching is decreased.

Moreover, the requirement of reducing the residual gas to avoid the risk of collision and/or improperly catching usually only appeared in the final portion of the implanting process (the time to prepare for moving the implanted away). Therefore, a duration of the second state (corresponding to the minority) usually is longer than a duration required to expel the gas until a residual portion of the gas cannot be moved away from the wafer when the power of said electrostatic chuck is off.

Although the invention does not limit the ratio of the majority to the minority, to effectively increase the wafer temperature to resolve/prevent water condensation, the duration of the second state usually is long enough, such that at least a meaningful portion of the implanting process is performed with less cooling. Here, the term "less cooling" indicates that a (e.g., the) meaningful portion of the implanting process is performed with less or even without any operation of the temperature adjusting apparatus.

Figure 3A:
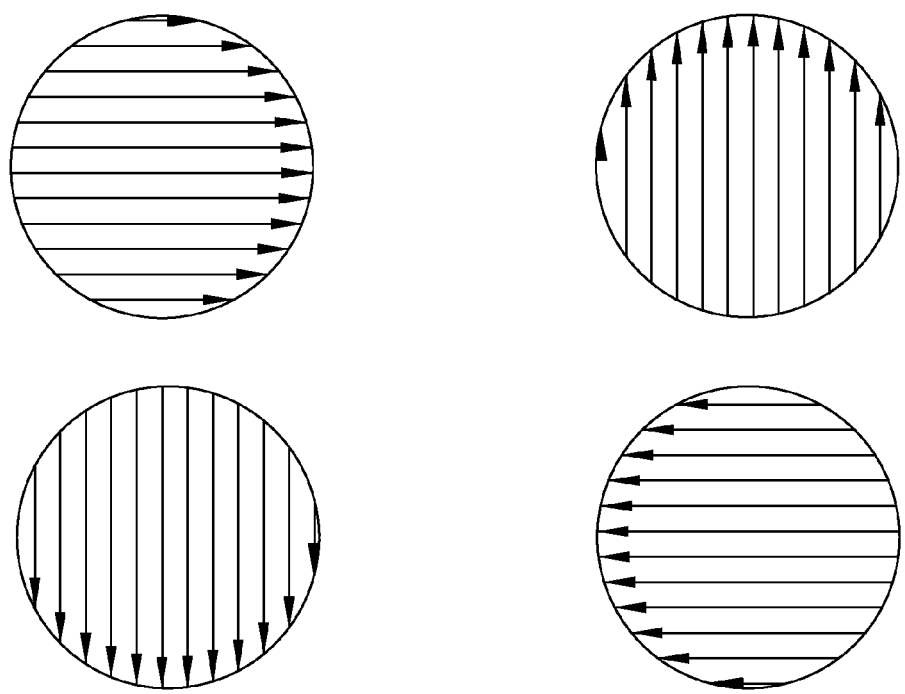
FIG. 3A to FIG. 3C show examples of low temperature ion implantation in accordance with the invention.

As a potential embodiment, the wafer is divided into several segments and then implanted in sequence. FIG. 3A shows the case where the wafer is divided into four quadrants, but the invention need not be limited to the shape and distribution of these segments. Here, the arrows indicate the scan paths that the ion beam is projected along to scan a whole surface of the wafer. The scan paths used to project the ion beam along in the majority (shown as single line arrows) may correspond to top three quadrants, and the scan paths used to project the ion beam in the minority (shown as double line arrows) may correspond to only the fourth quadrant, as shown in FIG. 3B.

Figure 3B:
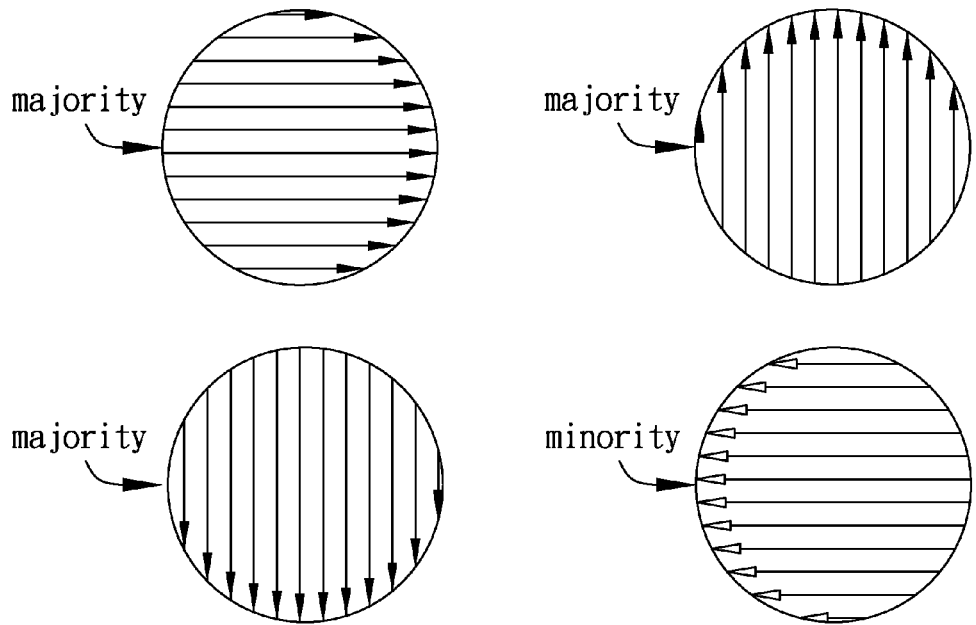
Figure 3C:
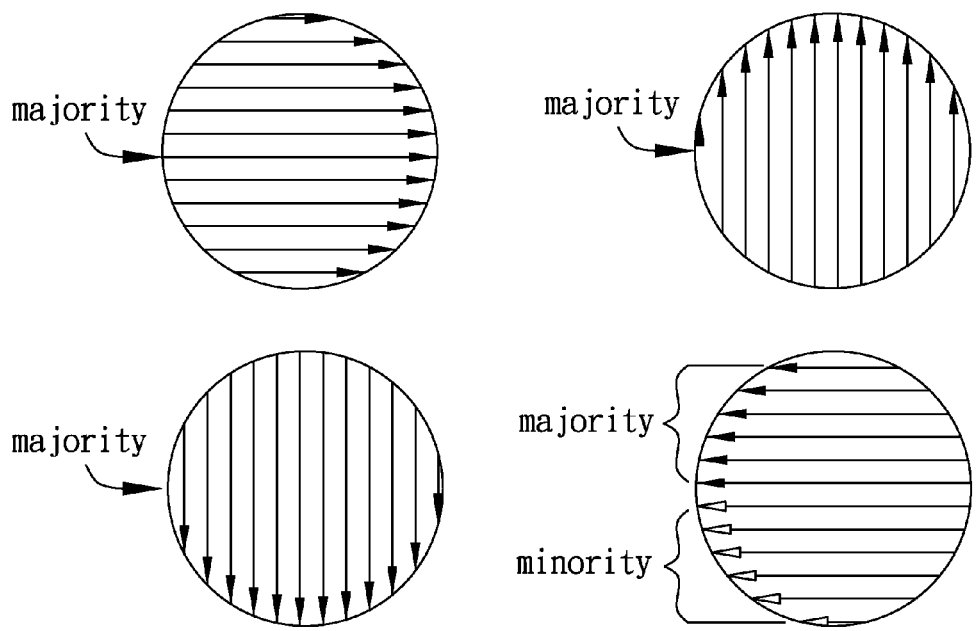

Moreover, as shown in FIG. 3C, when the wafer is scanned by the ion beam through numerous scan paths in each quadrant, the invention also allows for only a portion of the scan paths, such as the second half of the scan paths in the fourth quadrant, to be in the minority and other scan paths of the fourth quadrant still to be in the majority.

The example shown in FIGS. 3A to 3C is a two-dimensional scan in which the ion beam spot scans through the whole surface of the wafer using both vertical motion and horizontal motion. However, the invention is not limited to this operation and can also can be applied to a one-dimensional scan in which a line-shaped ion beam scans through the whole surface of the wafer using only horizontal motion. Indeed, the ion beam must pass through numerous scans to scan a whole wafer surface, regardless of whether the scan is one-dimensional or two-dimensional. Therefore, according to an aspect or feature, a requirement of the invention can be for the minority to correspond only to a last portion of these scans, such as a last one or more of the scans.

Figure 4:
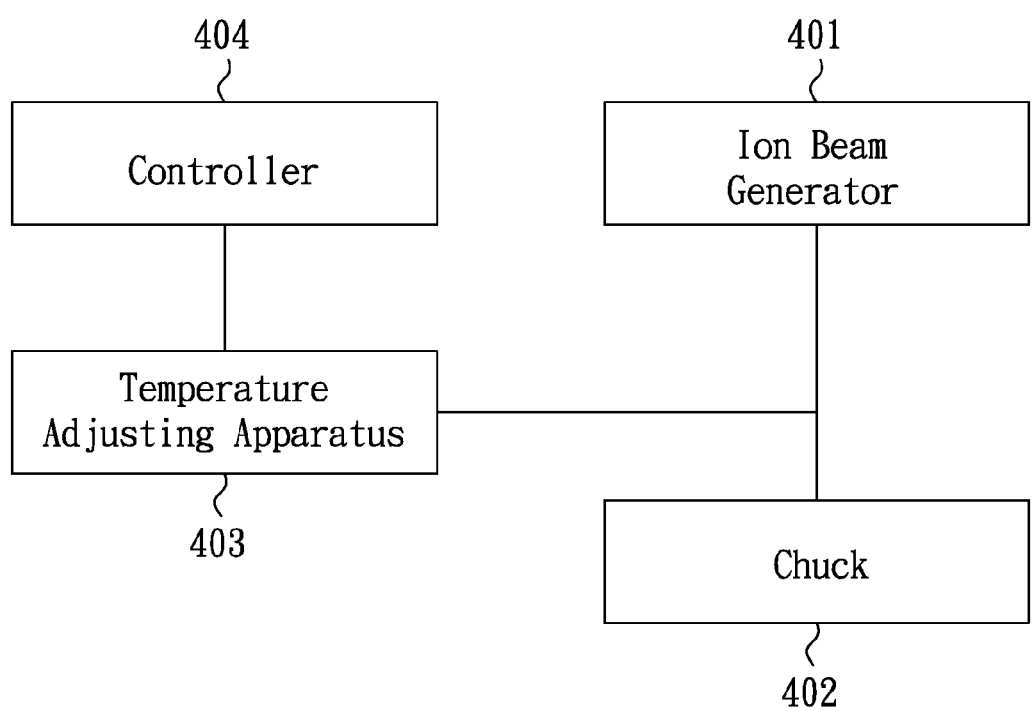
FIG. 4 is a diagram of an ion implanter for low temperature ion implantation in accordance with the invention.

Furthermore, when the invention only adjusts the operation of the temperature adjusting apparatus, the invention can be accomplished without significantly amending the current ion implanter. As shown in FIG. 4, the invention of an apparatus for low temperature ion implantation can comprise an ion beam generator 401 for generating an ion beam, a chuck 402 for holding a wafer during an implanting process in which the ion beam is projected into the wafer, a temperature adjusting apparatus 403 for adjusting a temperature of the wafer during the implanting process, and a controller 404 for controlling the temperature adjusting apparatus. Here, the characteristic essentially is the function of the controller 404, wherein the temperature adjusting apparatus 403 can be a new apparatus and/or a well-known apparatus.

The controller 404 is proposed to accomplish the above method by controlling the temperature adjusting apparatus 403. For example, the controller 404 is capable of dividing the implanting process into a majority portion and a minority portion, performing the majority first when the temperature adjusting apparatus 403 is in a first state to ensure that the wafer has a first temperature lower than a required temperature, and performing the minority later when the temperature adjusting apparatus 403 is in a second state to ensure that the wafer has a second temperature higher than the first temperature.

As discussed above, the temperature adjusting apparatus 403 comprises a cooler for cooling the wafer. Herein, the temperature adjusting apparatus 403 is capable of further comprising a heater for heating the wafer.

As discussed above, the cooler may be chosen from one or more of the following: a gas source and at least one gas pipeline for providing a gas to a backside of the wafer for removing heat; and a coolant and at least one coolant pipeline for providing a coolant to a chuck holding the wafer for cooling the wafer through a heat exchange between the wafer and the chuck.

Also, as discussed above, the heater may be chosen from one or more of the following: a resistor coil within a chuck for holding the wafer, such that heat appearing on the resistor coil is delivered through the chuck to the wafer; and a light source within a chamber surrounding the wafer during the implanting process, such that light is projected on the wafer followed by a temperature of the wafer being increased.

The invention is not intended to be limited on the means used to accomplish the controller 404 but only, according to one aspect, to limit the minimum functions of the controller 404. In other words, the controller 404 may be chosen from one or more of the following: an application specified integrated circuit, firmware, software, an interface to receive at least one instruction from an embedded operator interface, and an interface to receive at least one instruction from an external computer.

Although specific embodiments have been illustrated and described, it will be appreciated by those skilled in the art that various modifications may be made without departing from the scope of the present invention, which is intended to be limited solely by the appended claims.

What is claimed is:

1. A method for low temperature ion implantation, comprising:
   implanting a wafer in conjunction with a temperature adjusting apparatus adjusting a temperature of said wafer when said wafer is implanted, said temperature adjusting apparatus being in a first state to ensure said wafer ps cooled to a first temperature lower than a temperature of an environment outside of a chamber where said wafer is implanted; and
   implanting said wafer, said temperature adjusting apparatus being in a second state to ensure said wafer has a second temperature higher than said first temperature, whereby heat produced by said implanting process in said wafer when said temperature adjusting apparatus is in said second state remains at least partially within said wafer, such that a temperature of said wafer is increased;
   wherein said temperature adjusting apparatus has a cooler and a heater, and is changed from said first state to said second state (a) after occurrence of a majority of said implanting process or (b) by one or more of:
   turning off an operation of said temperature adjusting apparatus;
   decreasing said operation of said temperature adjusting apparatus;
   decreasing an operation of said cooler while an operation of said heater is kept constant;
   keeping said operation of said cooler constant while enhancing said operation of said heater;
   decreasing said operation of said cooler while said operation of said heater is enhanced;
   decreasing or turning off said operation of said cooler while said operation of said heater is off; and
   enhancing said operation of said cooler while said operation of said heater is enhanced more.

2. The method as recited in claim 1, wherein said cooler comprises one or more of the following:
   a gas source and at least one gas pipeline for providing a gas to a backside of said wafer for removing the heat; and
   a coolant and at least one coolant pipeline for providing a coolant to a chuck holding said wafer for cooling said wafer through a heat exchange between said wafer and said chuck.

3. The method as recited in claim 1, wherein said heater is chosen from one or more of the following:
   a resistor coil within a chuck for holding said wafer, such that the heat on said resistor coil is delivered, through said chuck, to said wafer; and
   a light source inside said chamber, such that light is projected on said wafer and then temperature of said wafer is increased.

4. The method as recited in claim 1, further comprising directly moving said wafer to said environment without any heating process after said implanting process is finished.

5. The method as recited in claim 4, wherein:
   said wafer is directly moved out from said chamber without a temporary stay in said chamber after said implanting process is finished; and
   said temperature of said wafer is increased during said temporary stay.

6. The method as recited in claim 1, further comprising performing one or more heating processes to said wafer after said implanting process is finished and before said wafer is moved into said environment.

7. The method as recited in claim 6, wherein said heating process is achieved by applying a warm nitrogen gas to said wafer after said implanting process is finished and before said wafer is moved into said environment.

8. The method as recited in claim 1, wherein said temperature adjusting apparatus uses a gas to cool a backside of said wafer and said wafer is held by an electrostatic chuck during said implanting process, a duration of said second state being longer than a duration required to expel said gas until a residual portion of said gas cannot be moved away from said wafer when a power of said electrostatic chuck is off.

9. The method as recited in claim 1, wherein a duration of said second state is long enough, such that at least a meaningful portion of said implanting process is performed with less cooling.

10. The method as recited in claim 9, wherein said meaningful portion of said implanting process is performed without any operation of said temperature adjusting apparatus.

11. The method as recited in claim 1, wherein said second temperature is gradually or fluctuantly increased during a duration of said second state.

12. The method as recited in claim 1, wherein said wafer is divided into some segments implanted in sequence, said first cooling state corresponding to at least the top several segments and said second state corresponding to at least a portion of the last segment.

13. The method as recited in claim 1, wherein said wafer is scanned through a plurality of scans during said implanting process, said second state corresponding to at least the last scan of said plurality of scans.

* * * * *

UNITED STATES PATENT AND TRADEMARK OFFICE
CERTIFICATE OF CORRECTION

PATENT NO. : 7,709,364 B1
APPLICATION NO. : 12/468822
DATED : May 4, 2010
INVENTOR(S) : Ko-Chuan Jen and Cheng-Hui Shen It is certified that error appears in the above-identified patent and that said Letters Patent is hereby corrected as shown below:

Col. 9, Line 10-44, Claim 1 should read as follows:

"1. A method for low temperature ion implantation, comprising:
    implanting a wafer in conjunction with a temperature adjusting apparatus adjusting a temperature of said wafer when said wafer is implanted, said temperature adjusting apparatus being in a first state to ensure said wafer is cooled to a first temperature lower than a temperature of an environment outside of a chamber where said wafer is implanted; and
    implanting said wafer, said temperature adjusting apparatus being in a second state to ensure said wafer has a second temperature higher than said first temperature, whereby heat produced by said implanting process in said wafer when said temperature adjusting apparatus is in said second state remains at least partially within said wafer, such that a temperature of said wafer is increased;
    wherein said temperature adjusting apparatus is changed from said first state to said second state (a) after occurrence of a majority of said implanting process or (b) by one or more of:
        turning off an operation of said temperature adjusting apparatus;
        decreasing said operation of said temperature adjusting apparatus;
        decreasing an operation of a cooler while an operation of a heater is kept constant;
        keeping an operation of a cooler constant while enhancing an operation of a heater;
        decreasing an operation of a cooler while an operation of a heater is enhanced;
        decreasing or turning off an operation of a cooler while an operation of a heater is off; and
        enhancing an operation of a cooler while an operation of a heater is enhanced more."

Signed and Sealed this
Seventeenth Day of May, 2011

David J. Kappos
*Director of the United States Patent and Trademark Office*